United States Patent
Honda

(10) Patent No.: US 10,352,700 B2
(45) Date of Patent: Jul. 16, 2019

(54) GYRO SENSOR AND ELECTRONIC APPARATUS

(71) Applicant: Sony Corporation, Tokyo (JP)

(72) Inventor: Junichi Honda, Tokyo (JP)

(73) Assignee: Sony Corporation, Tokyo (JP)

( * ) Notice: Subject to any disclaimer, the term of this patent is extended or adjusted under 35 U.S.C. 154(b) by 235 days.

(21) Appl. No.: 15/320,327

(22) PCT Filed: Mar. 31, 2015

(86) PCT No.: PCT/JP2015/001857
§ 371 (c)(1),
(2) Date: Dec. 20, 2016

(87) PCT Pub. No.: WO2015/198513
PCT Pub. Date: Dec. 30, 2015

(65) Prior Publication Data
US 2017/0205234 A1    Jul. 20, 2017

(30) Foreign Application Priority Data
Jun. 27, 2014    (JP) .................. 2014-132900

(51) Int. Cl.
*H01L 41/09* (2006.01)
*H01L 41/04* (2006.01)
(Continued)

(52) U.S. Cl.
CPC ........ *G01C 19/5621* (2013.01); *B06B 1/0611* (2013.01); *B06B 1/0622* (2013.01);
(Continued)

(58) Field of Classification Search
CPC ............ G01C 19/5621; G01C 19/5628; G01C 19/5607; G01C 19/5614; G01C 19/5642;
(Continued)

(56) References Cited

U.S. PATENT DOCUMENTS 5,691,594 A  *  11/1997   Takeuchi ............. H01L 41/081
                                                                310/328
6,498,419 B1    12/2002   Takeuchi et al.
(Continued)

FOREIGN PATENT DOCUMENTS

JP    2002-026412 A    1/2002
JP    2008-256669 A    10/2008
(Continued)

OTHER PUBLICATIONS

Japanese Office Action dated Mar. 26, 2019, in connection with Japanese Application No. 2016-528985, and English translation thereof.

*Primary Examiner* — Helen C Kwok
(74) *Attorney, Agent, or Firm* — Wolf, Greenfield & Sacks, P.C.

(57) ABSTRACT

A gyro sensor having increased sensitivity is provided, along with an electronic apparatus including the gyro sensor. The gyro sensor includes: a vibrator; a first piezoelectric layer, and a second piezoelectric layer. The first piezoelectric layer, which includes a first electrode pair and a first piezoelectric film arranged between the first electrode pair, is arranged on a front surface of the vibrator and is capable of causing the vibrator to vibrate in a first axis direction vertical to the front surface. The second piezoelectric layer, which includes a second electrode pair and a second piezoelectric film arranged between the second electrode pair, is arranged on the first piezoelectric layer and is capable of causing the vibrator to vibrate in the first axis direction. The second piezoelectric layer functions synchronously with the first piezoelectric layer to cause the vibrator to vibrate in the first axis direction.

9 Claims, 10 Drawing Sheets

(51) Int. Cl.
*G01C 19/5621* (2012.01)
*G01C 19/5628* (2012.01)
*B06B 1/06* (2006.01)
*H01L 41/113* (2006.01)
*H01L 41/297* (2013.01)

(52) U.S. Cl.
CPC ........ *G01C 19/5628* (2013.01); *H01L 41/042* (2013.01); *H01L 41/094* (2013.01); *H01L 41/1132* (2013.01); *H01L 41/297* (2013.01)

(58) Field of Classification Search
CPC .......................... G01C 19/5656; H01L 41/042; H01L 41/094; H01L 41/297; H01L 41/1132; H01L 41/0926; H01L 41/0946; H01L 41/27
See application file for complete search history.

(56) References Cited

U.S. PATENT DOCUMENTS

| | | | |
|---|---|---|---|
| 2008/0105052 A1* | 5/2008 | Takahashi | G01C 19/5607 73/504.16 |
| 2010/0064806 A1 | 3/2010 | Inaguma | |
| 2015/0243878 A1* | 8/2015 | Tanaka | G01P 9/04 428/697 |
| 2015/0340592 A1* | 11/2015 | Pirk | H01L 41/081 310/366 |

FOREIGN PATENT DOCUMENTS

| | | |
|---|---|---|
| JP | 2008-271667 A | 11/2008 |
| JP | 2010-071758 A | 4/2010 |
| JP | 2015-001420 A | 1/2015 |

* cited by examiner

GYRO SENSOR AND ELECTRONIC APPARATUS

CROSS REFERENCE TO RELATED APPLICATIONS

This application is a U.S. National Stage Entry under 35 U.S.C. § 371 of International Application No. PCT/JP2015/001857, filed in the Japanese Patent Office on Mar. 31, 2015, which claims priority to Japanese Patent Application Number JP2014-132900, filed in the Japanese Patent Office on Jun. 27, 2014, each of which is incorporated by reference herein in its entirety.

TECHNICAL FIELD

The present technology relates to a gyro sensor capable of detecting an angular velocity and an electronic apparatus including the gyro sensor.

BACKGROUND ART

As angular velocity sensors for consumer use, vibration-type gyro sensors are widely used. The vibration-type gyro sensor detects an angular velocity by causing a vibrator to vibrate at a predetermined frequency and detecting a Coriolis force caused in the vibrator using a piezoelectric device and the like. The gyro sensors are mounted on electronic apparatuses such as a video camera, a virtual reality apparatus, and a car navigation system and used as sensors for hand-movement detection, operation detection, direction detection, and the like.

In recent years, along with miniaturization and technical advancement in performance of electronic apparatuses, miniaturization and technical advancement in performance of gyro sensors that are to be mounted on those electronic apparatuses are being demanded. For example, for realizing miniaturization of gyro sensors, a technology called MEMS (Micro Electro Mechanical System) is generally used as described in Patent Document 1. Specifically, Patent Document 1 discloses an angular velocity sensor including three arm portions formed by performing microfabrication on a silicon substrate, a piezoelectric film formed on a front surface of each of the arm portions, an vibration driving electrode formed on the piezoelectric film of each of the two arm portions positioned on an outer side, and a detection electrode for detecting angular velocities, that is formed on the piezoelectric film of the center arm portion.

Patent Document 1: Japanese Patent Application Laid-open No. 2008-256669

SUMMARY

Problem to be Solved

The sensitivity of the Coriolis force detected by the gyro sensor is proportional to the weight and vibration velocity of the vibration system. Therefore, if the gyro sensor is miniaturized, the vibration system becomes lighter to thus lower the detection sensitivity that much. On the other hand, since an increase of the vibration velocity leads to an increase of the length and amplitude of the vibrator, it becomes an obstacle in realizing miniaturization of gyro sensors. From all this, it has been difficult to satisfy both the high sensitivity and miniaturization in principle since those elements are contradicting.

In view of the circumstances as described above, the present technology aims at providing a gyro sensor capable of raising a sensitivity even with the same amplitude and an electronic apparatus including the gyro sensor.

Means for Solving the Problem

According to an embodiment of the present technology, there is provided a gyro sensor including a vibrator, a first piezoelectric functional layer, and a second piezoelectric functional layer.

The first piezoelectric functional layer includes a first electrode pair and a first piezoelectric film arranged between the first electrode pair, is arranged on a front surface of the vibrator, and is capable of causing the vibrator to vibrate in a first axis direction vertical to the front surface.

The second piezoelectric functional layer includes a second electrode pair and a second piezoelectric film arranged between the second electrode pair, is arranged on the first piezoelectric functional layer, and is capable of causing the vibrator to vibrate in the first axis direction in sync with the first piezoelectric functional layer.

Since the first piezoelectric functional layer and the second piezoelectric functional layer are laminated on the front surface of the vibrator in the gyro sensor, the same amplitude as in a case where the vibrator is vibrated using a single piezoelectric functional layer can be obtained with a smaller application voltage amount. In addition, a detection voltage of the vibrator can be raised without increasing the amplitude or length of the vibrator.

Typically, the first electrode pair includes a first driving electrode, and the second electrode pair includes a second driving electrode.

The first driving electrode is connected to a driving circuit and causes the vibrator to vibrate in the first direction. The second driving electrode includes a second driving electrode that is connected to the driving circuit in parallel with the first driving electrode and causes the vibrator to vibrate in the first direction.

As a result, since the first piezoelectric functional layer and the second piezoelectric functional layer are connected to the driving circuit in parallel, the piezoelectric functional layers can be driven by a common driving voltage.

Typically, the first electrode pair includes a first electrode film arranged between the vibrator and the first piezoelectric film and a second electrode film that sandwiches the first piezoelectric film with the first electrode film. In this case, the second electrode pair may include a third electrode film and a detection electrode. The third electrode film is electrically connected to the second electrode film. The detection electrode sandwiches the second piezoelectric film with the third electrode film and detects a vibration of the vibrator in a second axis direction parallel to the front surface of the vibrator.

Accordingly, the Coriolis force that acts on the vibrator can be detected with high sensitivity.

The shape, configuration, and the like of the vibrator are not limited in particular and can be set as appropriate based on a device type. For example, the vibrator includes three arm portions arranged in the second axis direction and a base portion supporting the three arm portions. In this case, the first piezoelectric functional layer and the second piezoelectric functional layer are provided on a front surface of each of the three arm portions. Further, the detection electrode includes electrode portions respectively provided in the three arm portions and connection portions that are provided on the base portion and mutually connect the electrode portions of the two adjacent arm portions.

By providing the detection electrode at a root portion of the vibrator as described above, the sensitivity of the vibrator with respect to the Coriolis force becomes high, and thus the detection accuracy of angular velocities can be improved.

The electrode portion provided in the center arm portion out of the three arm portions may have a larger electrode length than the electrode portions of the two arm portions positioned on an outer side in a third axis direction orthogonal to the first axis direction and the second axis direction.

Accordingly, the detection accuracy of angular velocities can be additionally improved.

The connection portions may have a smaller electrode width than the electrode portions.

Accordingly, a parasitic capacity formed between the electrode film positioned on a lower side can be reduced to thus raise the detection accuracy of angular velocities.

The gyro sensor may further include a wiring layer. The wiring layer is provided on a front surface of the base portion and electrically connected to the first electrode film, the second electrode film, the third electrode film, and the detection electrode.

Accordingly, routing of the wiring becomes possible on a front surface side of the base portion.

Thicknesses of the first piezoelectric film and the second piezoelectric film are not limited in particular and can be set as appropriate based on target piezoelectric properties. Typically, the first piezoelectric film and the second piezoelectric film each have a thickness of 1 μm or less.

According to an embodiment of the present technology, there is provided an electronic apparatus including a gyro sensor.

The gyro sensor includes a vibrator, a first piezoelectric functional layer, and a second piezoelectric functional layer.

The first piezoelectric functional layer includes a first electrode pair and a first piezoelectric film arranged between the first electrode pair. The first piezoelectric functional layer is arranged on a front surface of the vibrator and is capable of causing the vibrator to vibrate in a first axis direction vertical to the front surface.

The second piezoelectric functional layer includes a second electrode pair and a second piezoelectric film arranged between the second electrode pair. The second piezoelectric functional layer is arranged on the first piezoelectric functional layer and is capable of causing the vibrator to vibrate in the first axis direction in sync with the first piezoelectric functional layer.

Effects

As described above, according to the present technology, the sensitivity can be raised even with the same amplitude.

It should be noted that the effects described herein are not necessarily limited, and any effect described in the present disclosure may be obtained.

DESCRIPTION OF PREFERRED EMBODIMENTS

Hereinafter, an embodiment of the present technology will be described with reference to the drawings.

Figure 1:
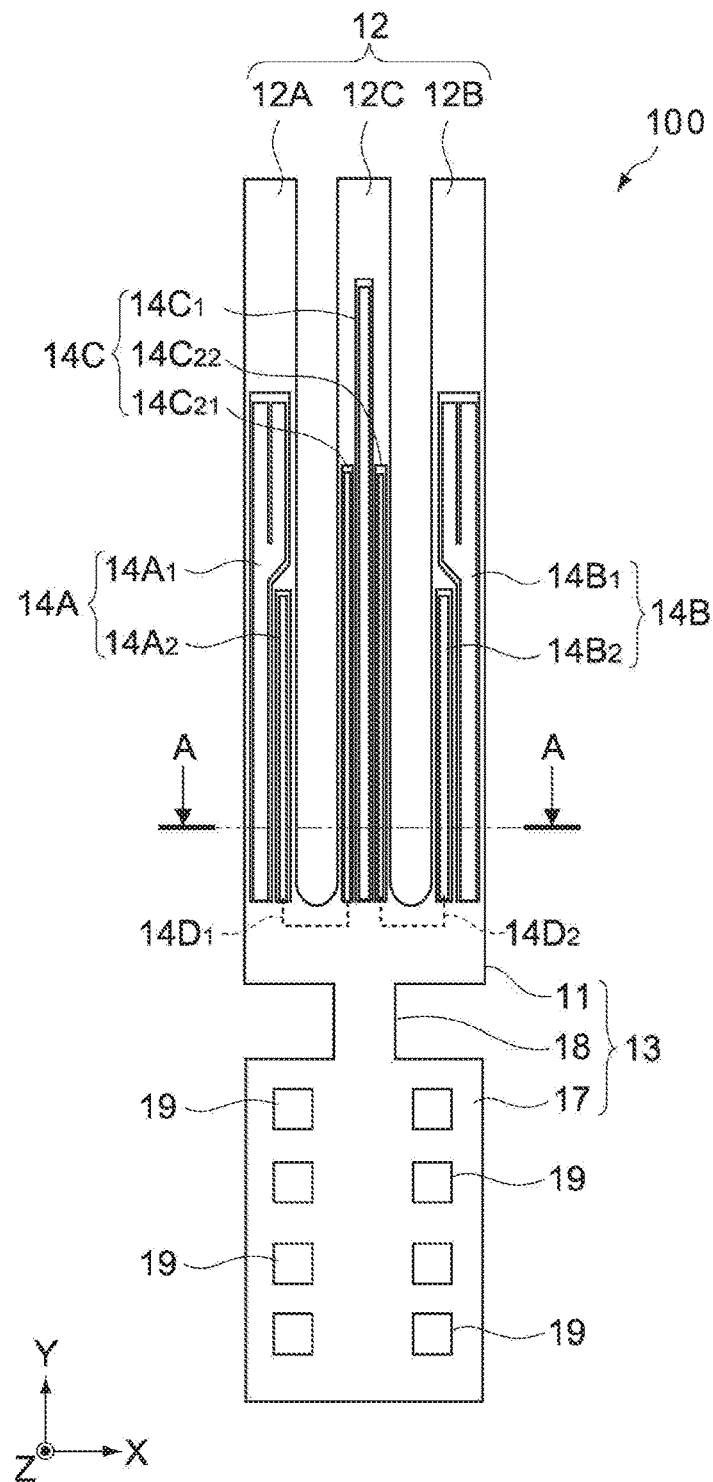
FIG. 1 A schematic plan view showing a gyro sensor according to an embodiment of the present technology.

FIG. 1 is a schematic plan view showing a gyro sensor 100 according to an embodiment of the present technology. Hereinafter, a basic configuration of the gyro sensor 100 will be described.

In the figure, X-, Y-, and Z-axis directions respectively indicate three axial directions orthogonal to one another. The same holds true for the subsequent figures.

(Basic Configuration of Gyro Sensor)

The gyro sensor 100 includes a coupling portion 11 and three arms 12 (12A, 12B, and 12C) that extend from the coupling portion 11 in the same direction (Y-axis direction) and each have a square-shaped cross section. The three arms 12 are aligned horizontally in the X-axis direction when seen from the Z-axis direction.

The gyro sensor 100 is configured by cutting out the coupling portion 11 and the arms 12 in a predetermined shape from a monocrystalline substrate not having a piezoelectric property, such as a silicon wafer, and forming piezoelectric functional layers, various lead wiring portions, and the like that are to be described later on one surface of each of the coupling portion 11 and the arms 12. It should be noted that a general size of the gyro sensor 100 is 0.5 mm, 3 mm, and 0.3 mm in the X-, Y-, and Z-axis directions, respectively. A length of each of the arms 12 (Y-axis direction) is 1.8 to 1.9 mm, and a width thereof (X-axis direction) is 0.1 mm.

The arms 12A to 12C configure a vibrator of the gyro sensor 100. The arms 12A to 12C are formed to have the same arm length, width, and thickness, but the configuration is not limited thereto. Of the arms 12A to 12C, the arms positioned on both sides will be referred to as outer arms 12A and 12B, and the arm positioned at the center will be referred to as center arm 12C. Hereinafter, structures provided in the arms 12 (12A, 12B, and 12C) are denoted by corresponding symbols (A, B, and C).

The gyro sensor 100 includes a fixing portion 17 for fixing the gyro sensor 100 onto a mounting substrate (not shown) and a supporting portion 18 that supportively connects the fixing portion 17 and the coupling portion 11. The coupling portion 11, the fixing portion 17, and the supporting portion 18 configure a base portion 13 that supports the arms 12 while enabling the arms 12 to vibrate.

The fixing portion 17 is capable of physically fixing and electrically connecting the gyro sensor 100 onto/to the mounting substrate. External connection terminals 19 are formed on the fixing portion 17 of the gyro sensor 100, and piezoelectric functional bodies 14A, 14B, and 14C respectively arranged on the front surfaces of the arms 12 are connected to the external connection terminals 19 via wirings (not shown).

The supporting portion 18 connects the coupling portion 11 and the fixing portion 17. By forming the supporting portion 18 to have a smaller width than the coupling portion 11 and the fixing portion 17, it becomes possible to suppress the vibration of the arms 12 from being transmitted to the fixing portion 17. The fixing portion 17 and the supporting portion 18 are typically configured by a silicon substrate formed integrally with the arms 12 (coupling portion 11).

The piezoelectric functional bodies 14A to 14C respectively include piezoelectric driving units $14A_1$, $14B_1$, and $14C_1$ that cause the arms 12 to vibrate and piezoelectric detection units $14A_2$, $14B_2$, $14C_{21}$, and $14C_{22}$ that each detect a Coriolis force that acts on the arms 12. The piezoelectric functional bodies 14A to 14C are respectively arranged on one of the front surfaces of the arms 12 within the same plane.

The piezoelectric driving units $14A_1$ and $14B_1$ are arranged on the outer arms 12A and 12B, respectively, and formed linearly along the Y-axis direction. The piezoelectric driving unit $14C_1$ is formed linearly along the Y-axis direction on an axial center of the center arm 12C, and a length thereof is larger than those of the piezoelectric driving units $14A_1$ and $14B_1$.

The piezoelectric detection units $14A_2$ and $14B_2$ are respectively arranged on the center-arm-12C-side of the outer arms 12A and 12B. The piezoelectric detection units $14C_{21}$ and $14C_{22}$ are arranged on both sides of the piezoelectric driving unit $14C_1$. The piezoelectric detection units $14A_2$ and $14C_{21}$ are electrically connected to each other via a connection portion $14D_1$ formed on the front surface of the coupling portion 11, and a voltage signal of the connection portion $14D_1$ is referenced as a detection signal common to the piezoelectric detection units $14A_2$ and $14C_{21}$. On the other hand, the piezoelectric detection units $14B_2$ and $14C_{22}$ are electrically connected to each other via a connection portion $14D_2$ formed on the front surface of the coupling portion 11, and a voltage signal of the connection portion $14D_2$ is referenced as a detection signal common to the piezoelectric detection units $14B_2$ and $14C_{22}$.

Upon receiving an input of a driving voltage, the piezoelectric driving units $14A_1$, $14B_1$, and $14C_1$ cause the arms 12 to vibrate in the Z-axis direction. At this time, the piezoelectric driving units $14A_1$, $14B_1$, and $14C_1$ are configured to cause the outer arms 12A and 12B to vibrate at an opposite phase from the center arm 12C. The piezoelectric detection units $14A_2$, $14B_2$, $14C_{21}$, and $14C_{22}$ are configured to output voltage signals corresponding to the Coriolis force that acts on the arms 12 in the X-axis direction.

The gyro sensor 100 is flip-chip mounted on a mounting substrate (circuit substrate) including a controller. The controller includes a driving circuit (self-oscillation circuit) that generates driving signals (AC voltages) to be input to the piezoelectric driving units $14A_1$, $14B_1$, and $14C_1$ and a detection circuit that detects a Coriolis force that acts on the arms 12 based on the voltage signals output from the piezoelectric detection units $14A_2$, $14B_2$, $14C_{21}$, and $14C_{22}$. The driving circuit generates a driving signal based on detection signals (sum signal) of the connection portions $14D_1$ and $14D_2$, and the detection circuit generates an angular velocity signal based on the detection signals (differential signal) of the connection portions $14D_1$ and $14D_2$.

The gyro sensor 100 is packaged with the mounting substrate as a sensor module. The sensor module is connected to a control circuit of the electronic apparatus via the mounting substrate. Examples of the electronic apparatus include a digital camera, a mobile information terminal, a mobile game device, and a handheld display apparatus.

Figure 2:
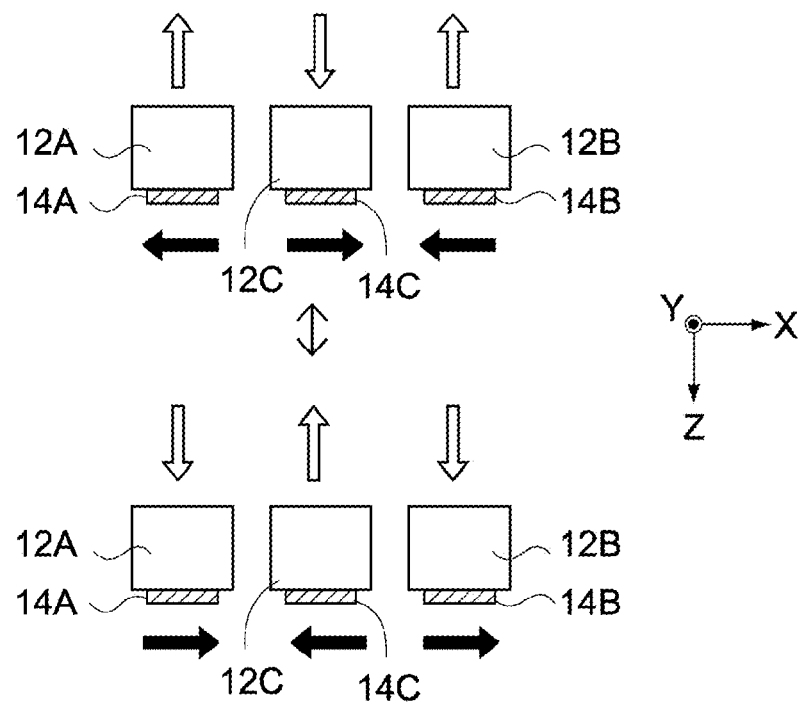
FIG. 2 Cross-sectional diagrams taken along the line A-A of FIG. 1, for explaining operations of the gyro sensor.

FIG. 2 are cross-sectional diagrams taken along the line A-A of FIG. 1, for explaining typical operations of the gyro sensor 100. It should be noted that the piezoelectric functional bodies 14A to 14C are illustrated schematically.

In the gyro sensor 100, the driving signals of the same phase are input to the piezoelectric driving units $14A_1$ and $14B_1$ of the outer arms 12A and 12B, and a driving signal of an opposite phase is input to the piezoelectric driving unit $14C_1$ of the center arm 12C, to thus cause the arms 12 to vibrate in the directions indicated by white arrows as shown in FIG. 2A (hereinafter, this state will be referred to as basic vibration).

At this time, while the piezoelectric detection units $14A_2$, $14B_2$, $14C_{21}$, and $14C_{22}$ generate voltage signals corresponding to distortion amounts of the arms 12, when the Coriolis force is not generated in the arms 12, the signals detected by the connection portions $14D_1$ and $14D_2$ become 0 in principle. Therefore, since the differential signal of the connection portions $14D_1$ and $14D_2$ also becomes 0, an angular velocity 0 is detected.

In contrast, when an angular velocity is generated about the Y axis while the gyro sensor 100 is undergoing the basic vibration, a Coriolis force acts on the arms 12 in the directions indicated by black arrows as shown in FIG. 2B. The Coriolis force acts in a direction orthogonal to the direction of the basic vibration of the arms, and the direction of the Coriolis force (plus/minus X direction) varies depending on the arm vibration direction (plus/minus Z direction). At this time, while the piezoelectric detection units $14A_2$, $14B_2$, $14C_{21}$, and $14C_{22}$ generate voltage signals corresponding to the distortion amounts of the arms 12, the signals detected by the connection portions $14D_1$ and $14D_2$ become the same size and of phases opposite to each other in principle. Therefore, by calculating a difference between those signals, an angular velocity signal twice the size of the signal values of the connection portions $14D_1$ and $14D_2$ is generated.

Figure 3:
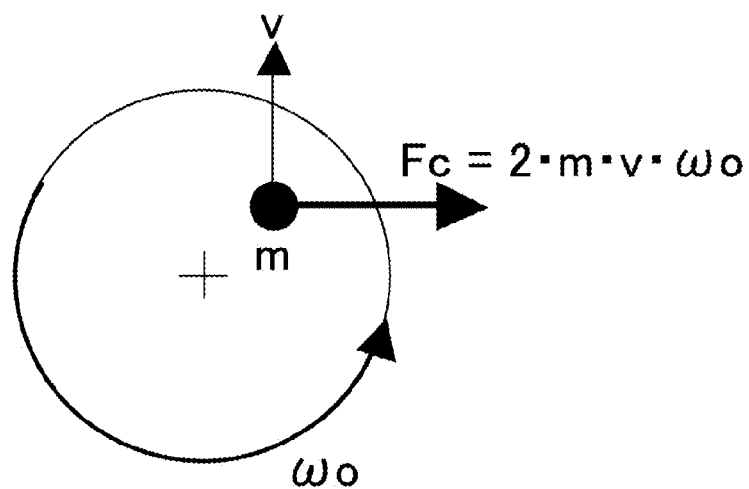
FIG. 3 A schematic diagram for explaining a Coriolis force detection principle.

Here, for raising S/N of the angular velocity signal, it is necessary to raise the detection sensitivity of the Coriolis force that is applied to the vibrator (arms 12). As shown in FIG. 3, when a mass of the arms 12, a vibration velocity of a bending movement of the arms 12, and a rotation angular velocity about a long axis of the arms 12 are represented by m, v, and $\omega_\theta$, respectively, the Coriolis force Fc can be expressed by Expression (1).

$$Fc = 2 * m * v * \omega_\theta \qquad (1)$$

As shown in Expression (1), the sensitivity of the Coriolis force is proportional to a weight and vibration velocity of a vibration system. Therefore, if the gyro sensor 100 is miniaturized, the vibration system becomes lighter to thus lower the detection sensitivity that much. On the other hand, while it is possible to raise the vibration velocity by increasing the length and amplitude of the vibrator, there is a problem that not only the length of the gyro sensor 100 increases, but the package also becomes large since a vibration space of the vibrator needs to be secured.

In this regard, in this embodiment, by adding refinements to the configuration of the piezoelectric functional bodies 14A to 14C, the sensitivity can be raised even with the same amplitude. As a result, the angular velocity detection sensitivity can also be raised. Hereinafter, the piezoelectric functional bodies 14A to 14C will be described in detail.

(Piezoelectric Functional Body)

Figure 4:
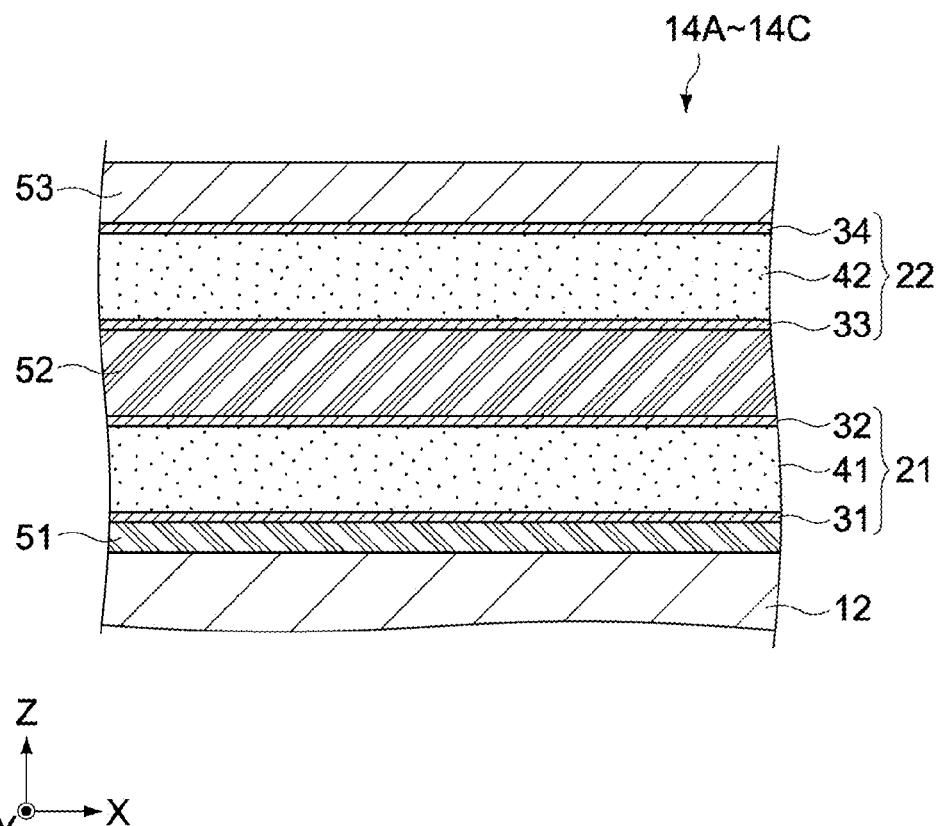
FIG. 4 A schematic cross-sectional diagram showing a configuration of a piezoelectric functional body of the gyro sensor.

FIG. 4 is a cross-sectional diagram schematically showing the configuration of the piezoelectric functional bodies 14A to 14C.

The piezoelectric functional bodies 14A to 14C each include a first piezoelectric functional layer 21 and a second piezoelectric functional layer 22.

(First Piezoelectric Functional Layer)

The first piezoelectric functional layer 21 includes a first electrode pair and a first piezoelectric film 41 arranged between the first electrode pair. The first electrode pair is configured by a first electrode film 31 and a second electrode film 32.

The first piezoelectric functional layer 21 is arranged on an insulation film 51 formed on the front surface of the arms 12. The insulation film 51 is typically configured by a thermally-oxidized film ($SiO_2$) deposited on the silicon substrate configuring the arms 12.

The first electrode film 31 is configured by a metal film and formed on the insulation film 51. The first electrode film 31 is configured by, for example, a laminated film including a titanium (Ti) film having a thickness of about 50 nm and a platinum (Pt) film having a thickness of about 100 nm. The Ti film and the Pt film described above are deposited by a sputtering method, for example, and the Pt film is deposited after the Ti film is subjected to high-temperature oxidation processing. As a result, a first piezoelectric film 41 (PZT film) having an excellent crystalline orientation property can be formed.

The first piezoelectric film 41 is typically formed of lead zirconium titanate (PZT), but the material is not limited thereto, and piezoelectric materials other than PZT may be used or a material including an additive may be used as PZT. The first piezoelectric film 41 is formed by a sputtering method in a thickness of 1 μm or less, for example. The first piezoelectric film 41 is subjected to the polarization processing such that it extends and contracts in the Y-axis direction according to a driving voltage applied between the first and second electrodes 31 and 32.

The second electrode film 32 is configured by a metal film or a conductive oxide film and formed on the first piezoelectric film 41. The second electrode film 32 is configured by a Pt film that is formed by a sputtering method and has a thickness of about 100 nm, for example.

As described above, by being input with the driving signal between the first and second electrodes 31 and 32, the first piezoelectric functional layer 21 is capable of causing the arms 12 to vibrate in a direction vertical to the front surface of the arms 12 (Z-axis direction).

Then, a potential difference corresponding to a bending vibration of the arms 12 in a direction vertical to (Z-axis direction) or parallel to (X-axis direction) the front surface of the arms 12 is generated between the first and second electrodes 31 and 32.

(Second Piezoelectric Functional Layer)

The second piezoelectric functional layer 22 includes a second electrode pair and a second piezoelectric film 42 arranged between the second electrode pair. The second electrode pair is configured by a third electrode film 33 and a fourth electrode film 34.

The second piezoelectric functional layer 22 is arranged on the first piezoelectric functional layer 21 via an intermediate insulation film 52. The intermediate insulation film 52 secures an insulation between the first piezoelectric functional layer 21 and the second piezoelectric functional layer 22 and also reduces damages of the first piezoelectric functional layer 21 at a time the second piezoelectric functional layer 22 is formed. The intermediate insulation film 52 is configured by a silicon oxide film ($SiO_2$) deposited on the second electrode film 32 by a sputtering method or a CVD method, for example.

The thickness of the intermediate insulation film 52 is not limited in particular and is, for example, 0.5 μm or more and 2 μm or less. This is because it becomes difficult to attain the object described above when the thickness is smaller than 0.5 μm, and a process for drawing out the first piezoelectric functional layer 21 becomes difficult when the thickness exceeds 2 μm.

An alumina film may be formed at an interface between the second electrode film 32 and the intermediate insulation film 52. Accordingly, an adhesive force between the second electrode film 32 and the intermediate insulation film 52 can be enhanced.

The third electrode film 33 is configured by a metal film and formed on the intermediate insulation film 52. Similar to the first electrode film 31, the third electrode film 31 is configured by a laminated film including a titanium (Ti) film having a thickness of about 50 nm and a platinum (Pt) film having a thickness of about 100 nm. The Ti film and the Pt film described above are deposited by a sputtering method, for example, and the Pt film is deposited after the Ti film is subjected to high-temperature oxidation processing. As a result, the second piezoelectric film 42 (PZT film) having an excellent crystalline orientation property can be formed.

The second piezoelectric film 42 is typically formed of lead zirconium titanate (PZT), but the material is not limited thereto, and piezoelectric materials other than PZT may be used or a material including an additive may be used as PZT. The second piezoelectric film 42 is formed by a sputtering method in a thickness of 1 μm or less, for example. The second piezoelectric film 42 is subjected to the polarization processing such that it extends and contracts in the Y-axis direction according to a driving voltage applied between the third and fourth electrodes 33 and 34.

The fourth electrode film 34 is configured by a metal film or a conductive oxide film and formed on the second piezoelectric film 42. The fourth electrode film 34 is configured by a Pt film that is formed by a sputtering method and has a thickness of about 100 nm, for example. An insulation film such as an alumina film and a photoresist film is formed on the fourth electrode film 34 as a protection film 53.

As described above, by being input with the driving signal between the third and fourth electrodes 33 and 34, the second piezoelectric functional layer 22 is capable of causing the arms 12 to vibrate in a direction vertical to the front surface of the arms 12 (Z-axis direction). In this embodiment, the second piezoelectric functional layer 22 is capable of causing the arms 12 to vibrate in the Z-axis direction in sync with the first piezoelectric functional layer 21.

Then, a potential difference corresponding to a bending vibration of the arms 12 in a direction vertical to (Z-axis direction) or parallel to (X-axis direction) the front surface of the arms 12 is generated between the third and fourth electrodes 33 and 34.

(Piezoelectric Driving Unit and Piezoelectric Detection Unit)

The piezoelectric driving units $14A_1$, $14B_1$, and $14C_1$ and the piezoelectric detection units $14A_2$, $14B_2$, $14C_{21}$, and $14C_{22}$ are configured by pattern-processing the piezoelectric functional bodies 14A to 14C each having the layer configuration described above in predetermined shapes.

Specifically, the piezoelectric functional body 14A is configured by arranging the piezoelectric driving unit $14A_1$ and the piezoelectric detection unit $14A_2$ on the same front surface of the outer arm 12A while being adjacent to each other, and the piezoelectric functional body 14B is configured by arranging the piezoelectric driving unit $14B_1$ and the piezoelectric detection unit $14B_2$ on the same front surface of the outer arm 12B while being adjacent to each other. The piezoelectric functional body 14C is configured by arranging the piezoelectric driving unit $14C_1$ and the piezoelectric detection units $14C_{21}$ and $14C_{22}$ on the same front surface of the center arm 12C while being adjacent to one another.

As described above, the piezoelectric driving units $14A_1$, $14B_1$, and $14C_1$ and the piezoelectric detection units $14A_2$, $14B_2$, $14C_{21}$, and $14C_{22}$ are configured to be independent from one another. Accordingly, it becomes possible to perform a stable oscillation operation and angular velocity detection operation without the adjacent piezoelectric driving units and piezoelectric detection units affecting one another.

Subsequently, wiring configurations of the piezoelectric driving units $14A_1$, $14B_1$, and $14C_1$ and the piezoelectric detection units $14A_2$, $14B_2$, $14C_{21}$, and $14C_{22}$ will be described.

Figure 5:
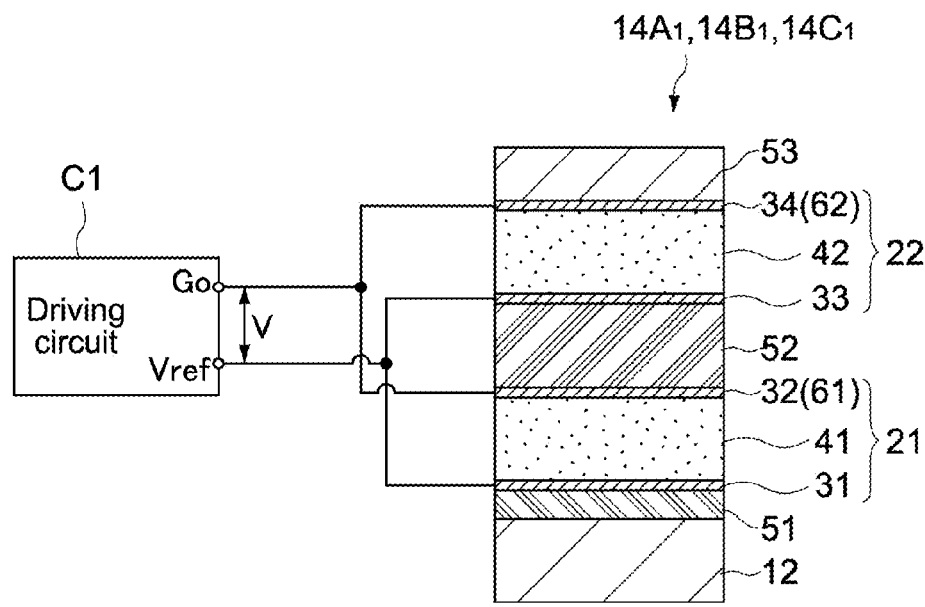
FIG. 5 A schematic diagram showing a wiring configuration of a piezoelectric driving unit in the gyro sensor with respect to a driving circuit.

FIG. 5 is a schematic diagram showing a wiring configuration of the piezoelectric driving units $14A_1$, $14B_1$, and $14C_1$ with respect to a driving circuit C1.

Regarding the piezoelectric driving units $14A_1$, $14B_1$, and $14C_1$, the second and fourth electrodes 32 and 34 are connected to a Go terminal of the driving circuit C1 in parallel, and the first and third electrodes 31 and 33 are connected to a Vref terminal of the driving circuit C1 in parallel as shown in FIG. 5. The piezoelectric driving units $14A_1$, $14B_1$, and $14C_1$ that are to be input with a predetermined driving signal V are connected to the driving circuit C1 via the external connection terminals 19 while being independent from one another.

The second and fourth electrodes 32 and 34 are respectively configured as a first driving electrode 61 and a second driving electrode 62 that are input with the driving signal V from the Go terminal of the driving circuit C1. On the other hand, the first and third electrodes 31 and 33 are commonly connected to a predetermined reference potential (e.g., ground potential) via the Vref terminal.

As described above, in the piezoelectric driving units $14A_1$, $14B_1$, and $14C_1$, the first and second piezoelectric functional layers 21 and 22 are connected in parallel to the driving circuit C1. Since driving signals for causing the arms 12 to vibrate at an oscillation frequency thereof are input commonly and at the same phase to the first driving electrode 61 and the second driving electrode 62, the first piezoelectric film 41 and the second piezoelectric film 42 extend and contract in sync with each other. Therefore, as compared to the case where a single piezoelectric film is used, the arms 12 are excited at the same amplitude in the Z-axis direction (FIG. 2) even with a smaller application voltage amount.

Figure 6:
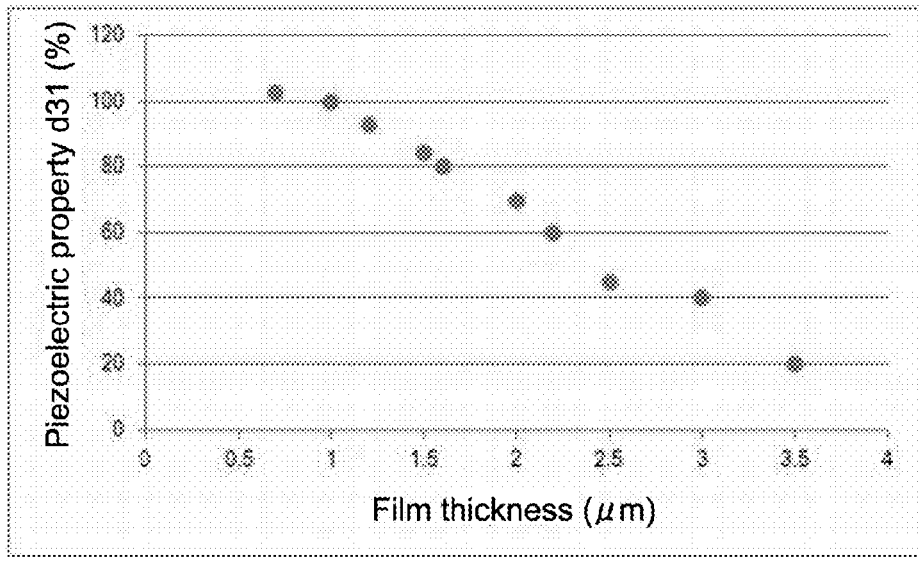
FIG. 6 An experimental result showing a relationship between a thickness and piezoelectric property of a piezoelectric film.

FIG. 6 is an experimental result that shows a film thickness-dependent property out of a piezoelectric property (d31) of a typical PZT film and shows the piezoelectric property at each film thickness with the piezoelectric property at a thickness of 1 μm being 100%. As shown in FIG. 6, when the thickness exceeds 1 μm, the piezoelectric property tends to deteriorate. This is considered to be because deterioration of a film quality such as a crystalline orientation property becomes prominent as the thickness increases. From this, it can be understood that when using a single piezoelectric film, there is a limit in the thickness of the piezoelectric film for obtaining a desired piezoelectric property.

In this embodiment, although the total thickness of the first and second piezoelectric films 41 and 42 exceeds 1 μm, the piezoelectric properties of the first and second piezoelectric films 41 and 42 are maintained at the piezoelectric property obtained when the thickness of each film is 1 μm or less. In addition, since the first and second piezoelectric functional layers 21 and 22 are laminated on each other and extend and contract in sync with each other, the same amplitude as in the case where the arms are vibrated by a single piezoelectric functional layer can be obtained with a smaller driving voltage. Accordingly, the detection voltage of the arms can be increased without increasing the amplitude and length of the arms 12 or increasing the driving voltage.

Figure 7:
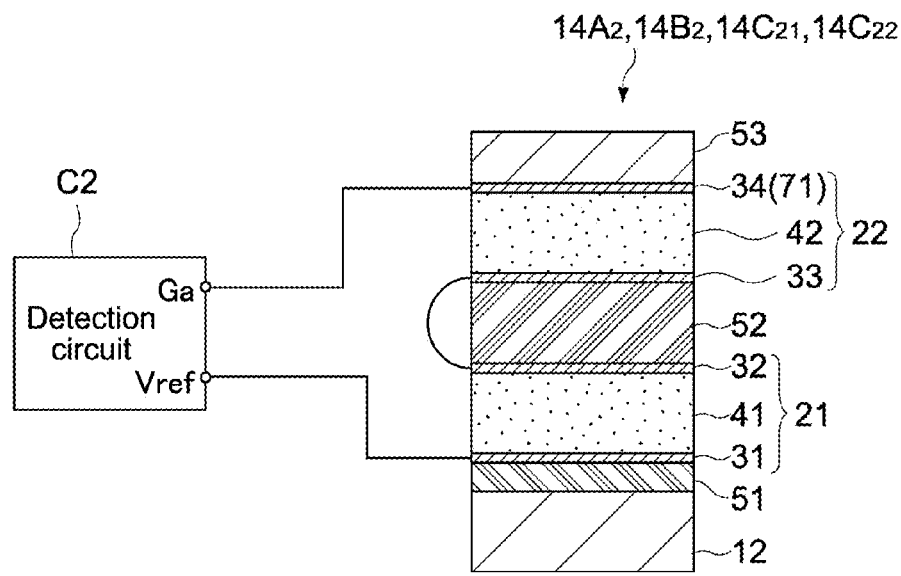
FIG. 7 A schematic diagram showing a wiring configuration with respect to a detection circuit of a piezoelectric detection unit in the gyro sensor.

On the other hand, the wiring configuration of the piezoelectric detection units $14A_2$, $14B_2$, $14C_{21}$, and $14C_{22}$ with respect to a detection circuit C2 is shown in FIG. 7.

Regarding the piezoelectric detection units $14A_2$, $14B_2$, $14C_{21}$, and $14C_{22}$, the fourth electrode film 34 is connected to a Ga terminal (voltage detection terminal) of the detection circuit C2, and the first electrode film 31 is connected to a Vref terminal of the detection circuit C2 as shown in FIG. 7. Further, the second and third electrodes 32 and 33 are electrically connected to each other. The piezoelectric detection units $14A_2$, $14B_2$, $14C_{21}$, and $14C_{22}$ are connected to the detection circuit C2 via the external connection terminals 19 while being independent from one another.

The fourth electrode film 34 is configured as a detection electrode 71 that generates detection signals to be input to the detection circuit C2. Further, the fourth electrode film 34 configures the connection portion $14D_1$ that connects the piezoelectric detection units $14A_2$ and the $14C_{21}$ and the connection portion $14D_2$ that connects the piezoelectric detection units $14B_2$ and the $14C_{22}$ (FIG. 1). On the other hand, the first electrode film 31 is connected to a predetermined reference potential (e.g., ground potential).

As described above, in the piezoelectric detection units $14A_2$, $14B_2$, $14C_{21}$, and $14C_{22}$, the first and second piezoelectric functional layers 21 and 22 are connected in series to the detection circuit C2. Accordingly, it becomes possible to input, to the detection circuit C2, a signal voltage corresponding to a sum of signal voltages generated by the first and second piezoelectric functional layers 21 and 22 due to bending of the arms 12. Therefore, the detection voltage of the arms 12 can be increased as compared to the case where a single piezoelectric functional layer is used. As a result, the angular velocity detection sensitivity can be raised.

Figure 8:
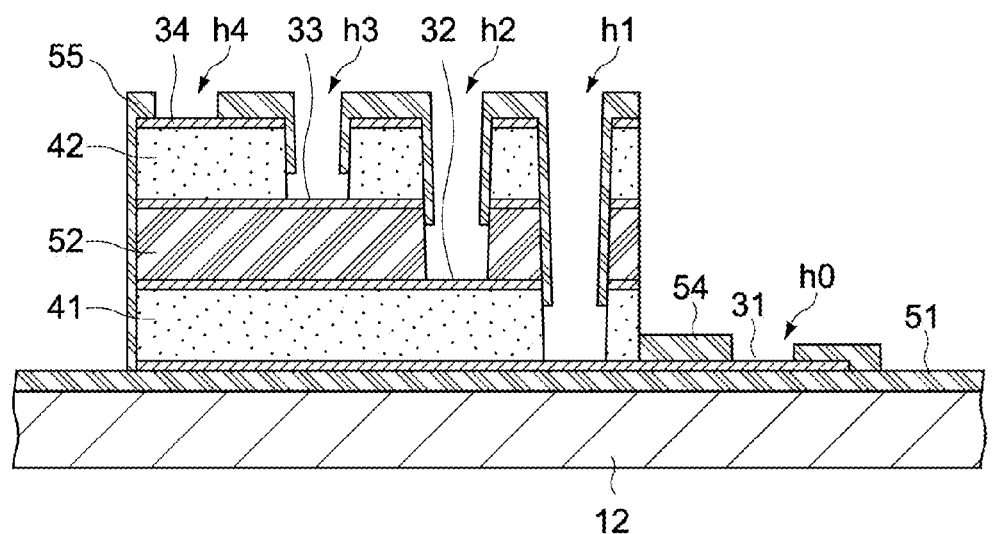
FIG. 8 A cross-sectional diagram showing a main portion, for explaining a wiring lead method of the piezoelectric functional body.

FIG. 8 is a schematic cross-sectional diagram showing a main portion, for explaining a wiring lead method of the piezoelectric functional bodies 14A to 14C (piezoelectric driving units $14A_1$, $14B_1$, and $14C_1$ and piezoelectric detection units $14A_2$, $14B_2$, $14C_{21}$, and $14C_{22}$).

In producing the piezoelectric functional bodies 14A to 14C, first, the first electrode film 31, the first piezoelectric film 41, the second electrode film 32, the intermediate insulation film 52, the third electrode film 33, the second piezoelectric film 42, and the fourth electrode film 34 (if necessary, insulation film that covers fourth electrode film 34) are sequentially formed on the front surface (on insulation film 51) of the arms 12. After that, the formed laminated body is patterned by, for example, a dry etching method using a known photolithography technology for each of the piezoelectric driving units $14A_1$, $14B_1$, and $14C_1$ and the piezoelectric detection units $14A_2$, $14B_2$, $14C_{21}$, and $14C_{22}$.

At this time (or in process before or after that process), bottomed connection holes h0 to h4 that respectively reach the electrode films 31 to 34 of the respective layers are sequentially formed on the front surface of the laminated body. The connection holes h0 to h4 are formed at arbitrary positions on the front surface of the coupling portion 11 (FIG. 1), for example. The order of forming the connection holes h0 to h4 is not limited in particular, and the connection holes are formed in the stated order of the connection holes h4, h3, h2, h1, and h0, for example. The formation method is also not limited in particular, and a dry etching method that uses a known photolithography technology is used, for example.

The connection hole h0 is formed on an insulation film 54 that covers the first electrode film 31 and exposes the first electrode film 31 via the insulation film 54.

The connection hole h1 is formed so as to penetrate through the laminated film from the first piezoelectric film 41 to the fourth electrode film 34 and exposes the first electrode film 31 from the laminated film.

The connection hole h2 is formed so as to penetrate through the laminated film from the intermediate insulation film 52 to the fourth electrode film 34 and exposes the second electrode film 32 from the laminated body.

The connection hole h3 is formed so as to penetrate through the laminated film from the second piezoelectric film 42 to the fourth electrode film 34 and exposes the third electrode film 33 from the laminated film.

The connection hole h4 is formed on an insulation film 55 that covers the front surface of the laminated body and side walls of the connection holes h1 to h3 and exposes the fourth electrode film 34 from the insulation film 55.

The connection holes h0 to h4 electrically connect predetermined electrode films and the external connection terminals 19 or mutually connect the predetermined electrode films, and the electrode films 31 to 34 are wired via a wiring layer deposited on the insulation films 54 and 55. By forming the wiring layer on the front surface of the base portion 13 (coupling portion 11), routing of wiring among the electrode films 31 to 34 and the external connection terminals 19 becomes easy.

Figure 9:
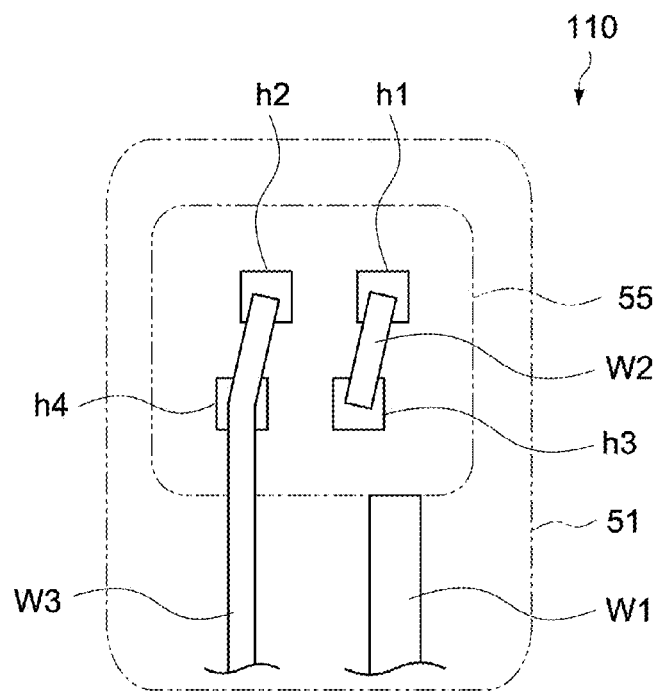
FIG. 9 A schematic plan view of the main portion, that shows a wiring lead unit of the piezoelectric driving unit.
Figure 10:
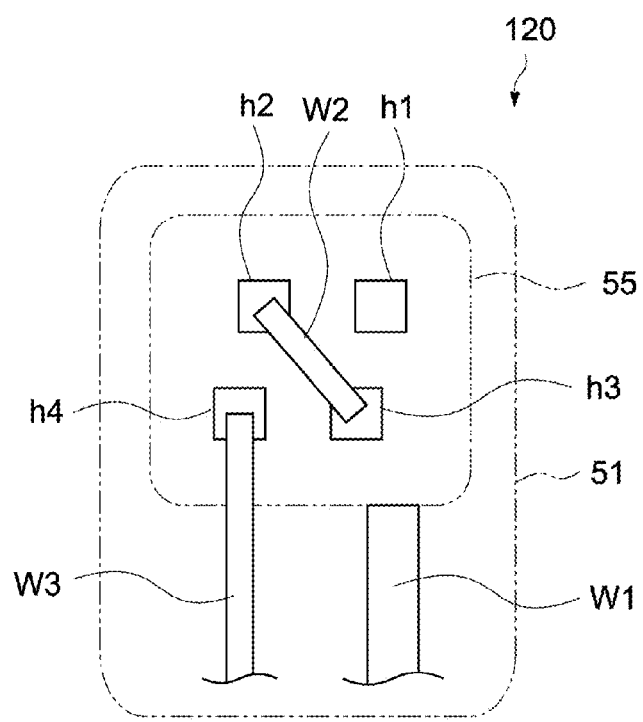
FIG. 10 A schematic plan view of the main portion, that shows a wiring lead unit of the piezoelectric detection unit.
Figure 11:
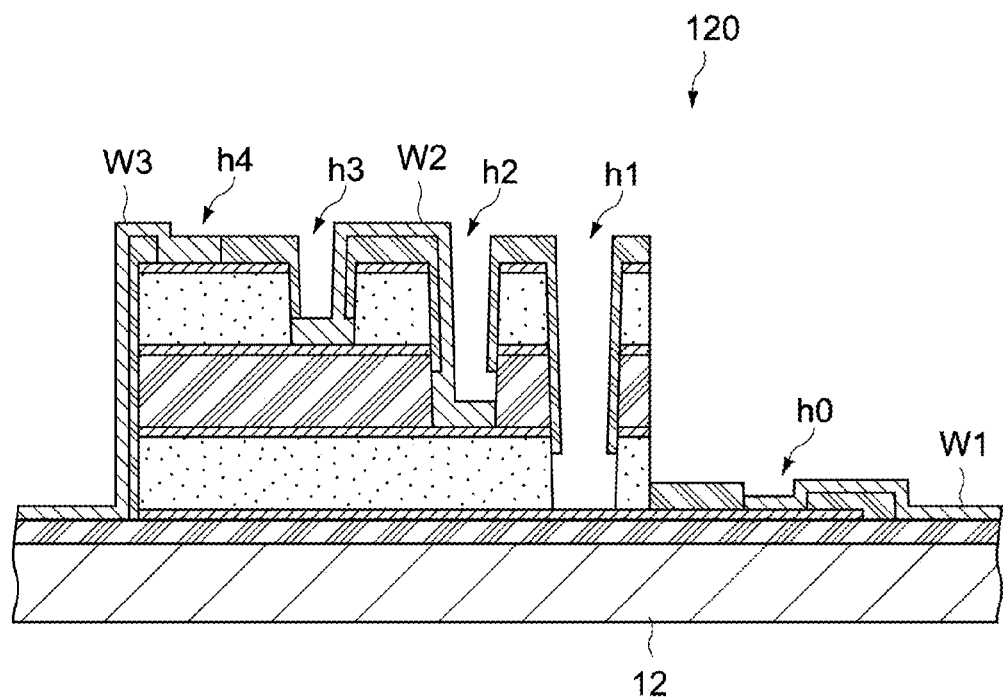
FIG. 11 A schematic cross-sectional diagram of the main portion, that shows the wiring lead unit of the piezoelectric detection unit.

FIG. 9 is a schematic plan view showing a configuration example of a wiring lead unit 110 of the piezoelectric driving units $14A_1$, $14B_1$, and $14C_1$, and FIG. 10 is a schematic plan view showing a configuration example of a wiring lead unit 120 of the piezoelectric detection units $14A_2$, $14B_2$, $14C_{21}$, and $14C_{22}$. FIG. 11 is a cross-sectional diagram showing a main portion of the wiring lead unit 120. In the figures, W1 to W3 indicate the wiring layer connected to the electrode films 31 to 34. The wiring lead units 110 and 120 are provided on the front surface side of the coupling portion 11 (FIG. 1).

It should be noted that in FIGS. 8 to 11, the positions of the connection holes h0 to h4 are illustrated conveniently to help understand the configuration. For example, the positions of the connection holes h1 to h4 do not necessarily correspond between FIGS. 8 and 11 and FIGS. 9 and 10.

As described above, according to the gyro sensor 100 of this embodiment, since the piezoelectric functional bodies 14A to 14C each include the laminated configuration of the plurality of piezoelectric functional layers, that is, the first and second piezoelectric functional layers 21 and 22, the same amplitude as in the case where the piezoelectric functional bodies are each configured by a single piezoelectric functional layer can be obtained with a smaller driving voltage. Moreover, the detection voltage of the arms 12 can be raised without increasing the length and amplitude of the arms 12, and thus the Coriolis force (angular velocity) detection sensitivity can be significantly raised. Furthermore, since the vibration velocity of the arms 12 can be increased, voltage values of driving signals requisite for the basic vibration (oscillation) of the arms 12 can be made small.

Figure 12:
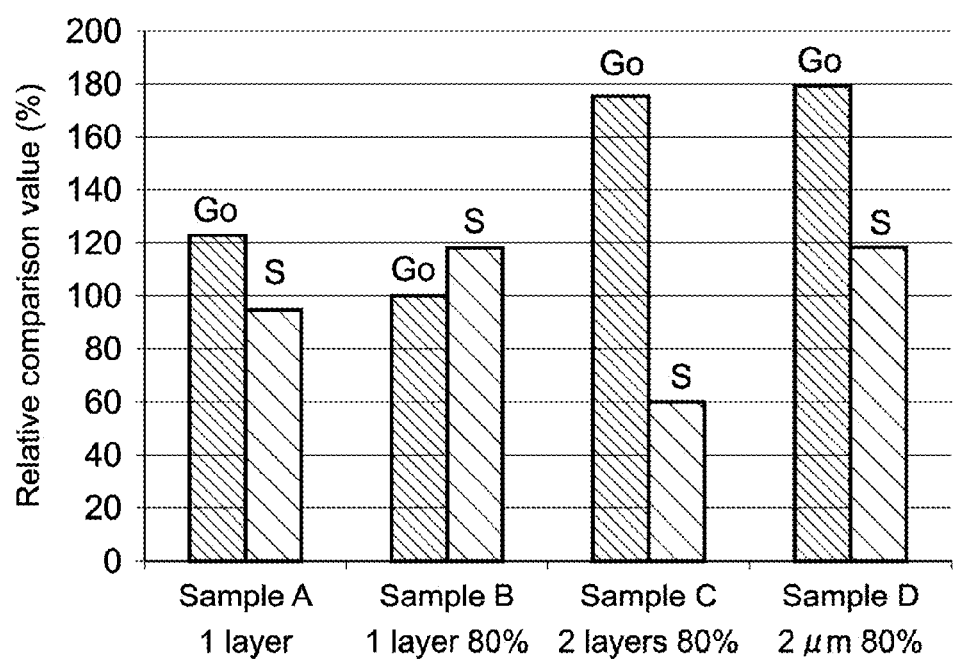
FIG. 12 An experimental result showing a driving voltage property and a detection sensitivity property that have been measured with respect to a plurality of samples having different configurations of the piezoelectric film configuring the piezoelectric functional body.

The inventors of the present technology produced samples A to D of a plurality of gyro sensors having different thicknesses of the piezoelectric films and different number of layers and compared a driving voltage Go requisite for the oscillation drive of the arms and an angular velocity detection sensitivity S of those samples. The result thereof is shown in FIG. 12. It should be noted that the samples were adjusted such that the oscillation amplitudes of the vibrators become constant.

The piezoelectric film of the sample A is constituted of a single-layer PZT film having a thickness of 1 μm, and the piezoelectric film of the sample B is constituted of a PZT film having a piezoelectric property corresponding to 80% the piezoelectric property of the sample A. The piezoelectric film of the sample C is obtained by laminating two piezoelectric films of the sample B and corresponds to the configuration of the piezoelectric functional body of this embodiment, for example. Further, the piezoelectric film of the sample D is constituted of a single-layer PZT film having a thickness of 2 μm and has a piezoelectric property corresponding to 80% the piezoelectric property of the PZT film.

Using the property of the sample A shown in FIG. 12 as a reference, the driving property becomes higher as the relative comparison value on the ordinate axis becomes higher for the driving voltage Go, and the sensitivity property becomes higher as the relative comparison value becomes lower for the detection sensitivity S. In this case, it can be seen that both the driving property and the sensitivity property are lowered for the sample B and that the sensitivity property is lowered while the driving property is improved for the sample D. In contrast, it can be seen that both the driving property and the sensitivity property are improved for the sample C.

As described above, according to this embodiment, it was confirmed that both the driving property and the sensitivity property are improved as compared to the gyro sensor having a single-layer piezoelectric film.

(Layout of Piezoelectric Detection Unit)

As described above, in the gyro sensor in which the vibration arms oscillate in a direction vertical to the deposition surface of the piezoelectric films, by causing the vibration arms to be displaced in a direction vertical to the length direction of the arms within the deposition surface by the Coriolis force, a signal corresponding to the displacement is generated in the piezoelectric films, and the signal is processed as an angular velocity by a detection signal processing circuit. Since a large deformation due to the Coriolis force occurs at both sides of the root portion of the vibration arms in the width direction, by arranging the piezoelectric detection units at those portions, the sensitivity of the vibrator with respect to the Coriolis force becomes high, and thus a vibrator with which electrical signals corresponding to angular velocities can be obtained with a high conversion efficiency can be formed.

In the gyro sensor 100 of this embodiment, the piezoelectric detection units $14C_{21}$ and $14C_{22}$ are arranged on both sides of the root portion (connection portion with respect to coupling portion 11) of the center arm 12C in the width direction (X-axis direction) as shown in FIG. 1. Accordingly, a bending vibration due to the Coriolis force can be detected with a high sensitivity at the root portion of the center arm 12C. It should be noted that the piezoelectric detection units may be arranged in not only the center arm 12C but also on both sides of the root portion of the outer arms 12A and 12B in the width direction to thus additionally raise the angular velocity detection sensitivity.

Also in the gyro sensor 100 of this embodiment, the piezoelectric detection units $14C_{21}$ and $14C_{22}$ provided in the center arm 12C have longer electrode lengths in the Y-axis direction than the piezoelectric detection units $14A_2$ and $14B_2$ respectively provided in the outer arms 12A and 12B. Also with such a configuration, a favorable angular velocity detection sensitivity can be obtained.

Figure 13:
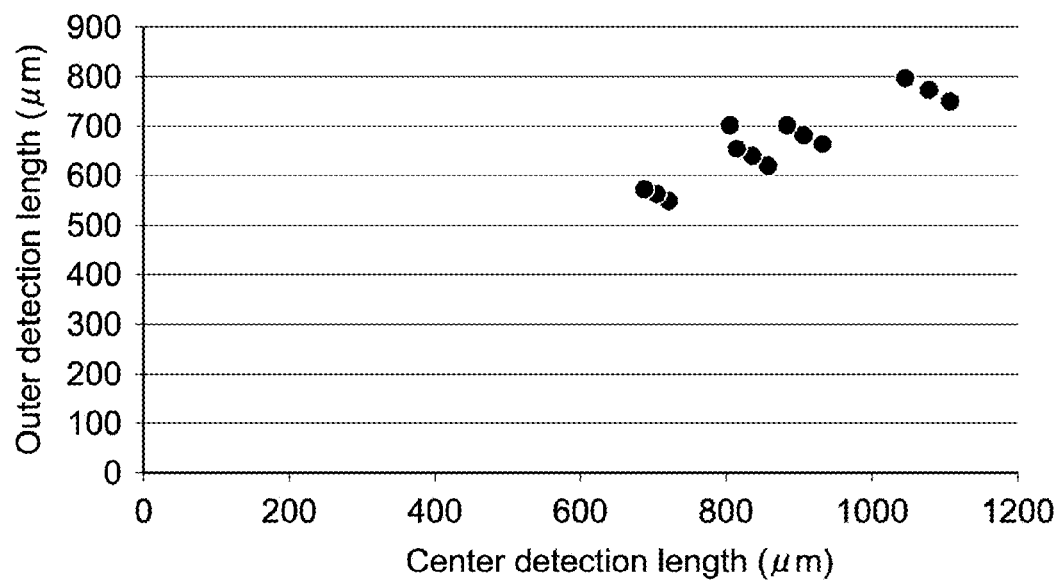
FIG. 13 An experimental result showing a relative ratio of the electrode lengths of the piezoelectric detection unit between adjacent arms, with which a relatively-favorable sensitivity property can be obtained in the gyro sensor.

FIG. 13 is an experimental result showing a relationship between the electrode length of the piezoelectric detection units $14C_{21}$ and $14C_{22}$ (center detection length) and that of the piezoelectric detection units $14A_2$ and $14B_2$ (outer detection length), with which a relatively-favorable angular velocity detection sensitivity can be obtained. As shown in FIG. 13, by setting the electrode length on the outer arms 12A and 12B side to be, for example, 70% or more and 80% or less the electrode length on the center arm 12C side, a favorable angular velocity detection sensitivity can be obtained.

Further, in this embodiment, the piezoelectric detection units $14A_2$ and $14B_2$ on the outer arms 12A and 12B side and the piezoelectric detection units $14C_{21}$ and $14C_{22}$ on the center arm 12C side are mutually connected via the connection portions $14D_1$ and $14D_2$. Accordingly, highly-accurate angular velocity detection can be performed without being influenced by accelerations applied to the gyro sensor 100.

Figure 14:
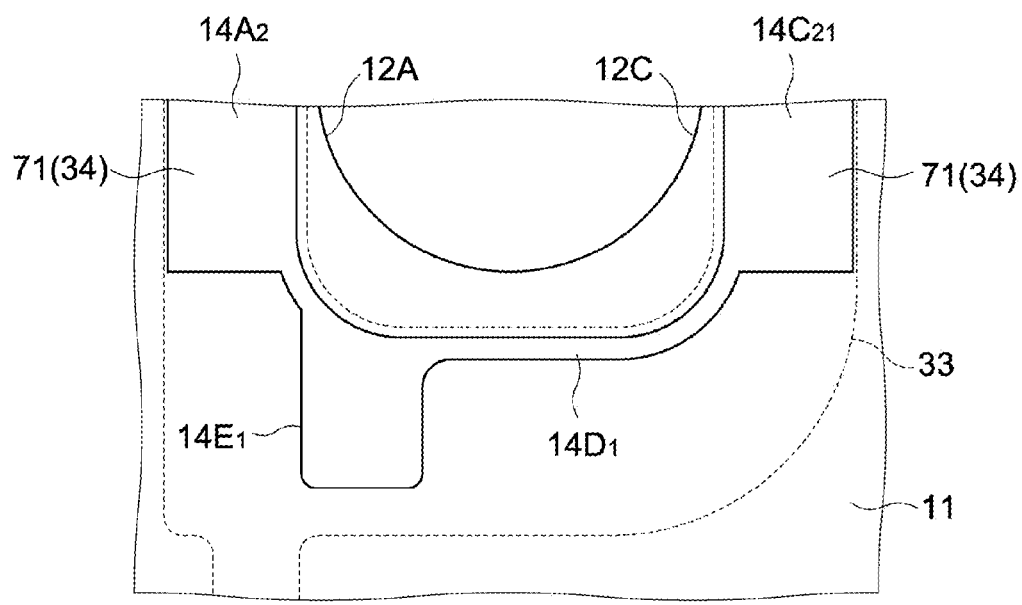
FIG. 14 A schematic plan view of the main portion, that shows a configuration of a connection portion of the piezoelectric detection unit between adjacent arms in the gyro sensor.

FIG. 14 is a plan view of a main portion, that shows the root portions of the outer arm 12A and the center arm 12C. As shown in FIG. 14, the connection portion $14D_1$ is configured on the same layer as the detection electrode 71 (fourth electrode film 34) of the piezoelectric detection units $14A_2$ and the $14C_{21}$. The connection portion $14D_1$ is formed on the front surface of the coupling portion 11, but the first electrode film 31, the first piezoelectric film 41, the second electrode film 32, the intermediate insulation film 52, the third electrode film 33, and the second piezoelectric film 42 exist as base layers in the production process. Therefore, the connection portion $14D_1$ opposes the third electrode film 33 via the second piezoelectric film 42, and thus there is fear that deterioration of the angular velocity detection signals due to a wiring capacity (or parasitic capacity) among the electrodes may be induced.

In this regard, in this embodiment, the electrode width of the connection portion $14D_1$ is smaller than that of the detection electrode 71 of the piezoelectric detection units $14A_2$ and the $14C_{21}$ as shown in FIG. 14. Accordingly, the wiring capacity between the connection portion $14D_1$ and the third electrode film 33 is reduced, and deterioration of the angular velocity detection property is suppressed.

Furthermore, as shown in FIG. 14, a terminal portion $14E_1$ as a wiring connection area with respect to the lead wiring portion (not shown) connecting with the external connection terminals 19 is formed in the connection portion $14D_1$. An area of the terminal portion $14E_1$ is smaller the better for reasons similar to those described above. In this embodiment, the terminal portion $14E_1$ is formed in a size 20% or less, for example, 5% or more and 10% or less, the area of the detection electrode 71 on the center arm 12C or the outer arms 12A and 12B. Accordingly, deterioration of the angular velocity detection sensitivity can be suppressed effectively.

Heretofore, the connection portion $14D_1$ has been described in detail. The connection portion $14D_2$ on the other side is configured similarly.

(Polarization Processing)

As shown in FIGS. 5 and 7, in the gyro sensor 100 of this embodiment, the first and second piezoelectric functional layers 21 and 22 configuring each of the piezoelectric driving units $14A_1$, $14B_1$, and $14C_1$ are connected to the driving circuit C1 in parallel, and the first and second piezoelectric functional layers 21 and 22 configuring each of the piezoelectric detection units $14A_2$, $14B_2$, $14C_{21}$, and $14C_{22}$ are connected to the detection circuit C2 in series.

Therefore, particularly in the piezoelectric detection units, during the polarization processing of the first and second piezoelectric films 41 and 42, an electric field to be applied to the piezoelectric films is halved, so a piezoelectric property required for the piezoelectric detection units cannot be obtained. On the other hand, when a voltage requisite for the polarization processing is increased for obtaining a piezoelectric property of the piezoelectric detection units, the voltage to be applied to the piezoelectric films of the piezoelectric driving units also increases, to thus induce element deterioration of the piezoelectric driving units or cause a difference in the piezoelectric properties among the piezoelectric driving units and the piezoelectric detection units.

In this regard, in this embodiment, by executing the polarization processing of the piezoelectric detection units by the following procedure, the polarization processing of the piezoelectric films of the piezoelectric driving units $14A_1$, $14B_1$, and $14C_1$ and the piezoelectric detection units $14A_2$, $14B_2$, $14C_{21}$, and $14C_{22}$ can be performed under appropriate conditions.

Figure 15:
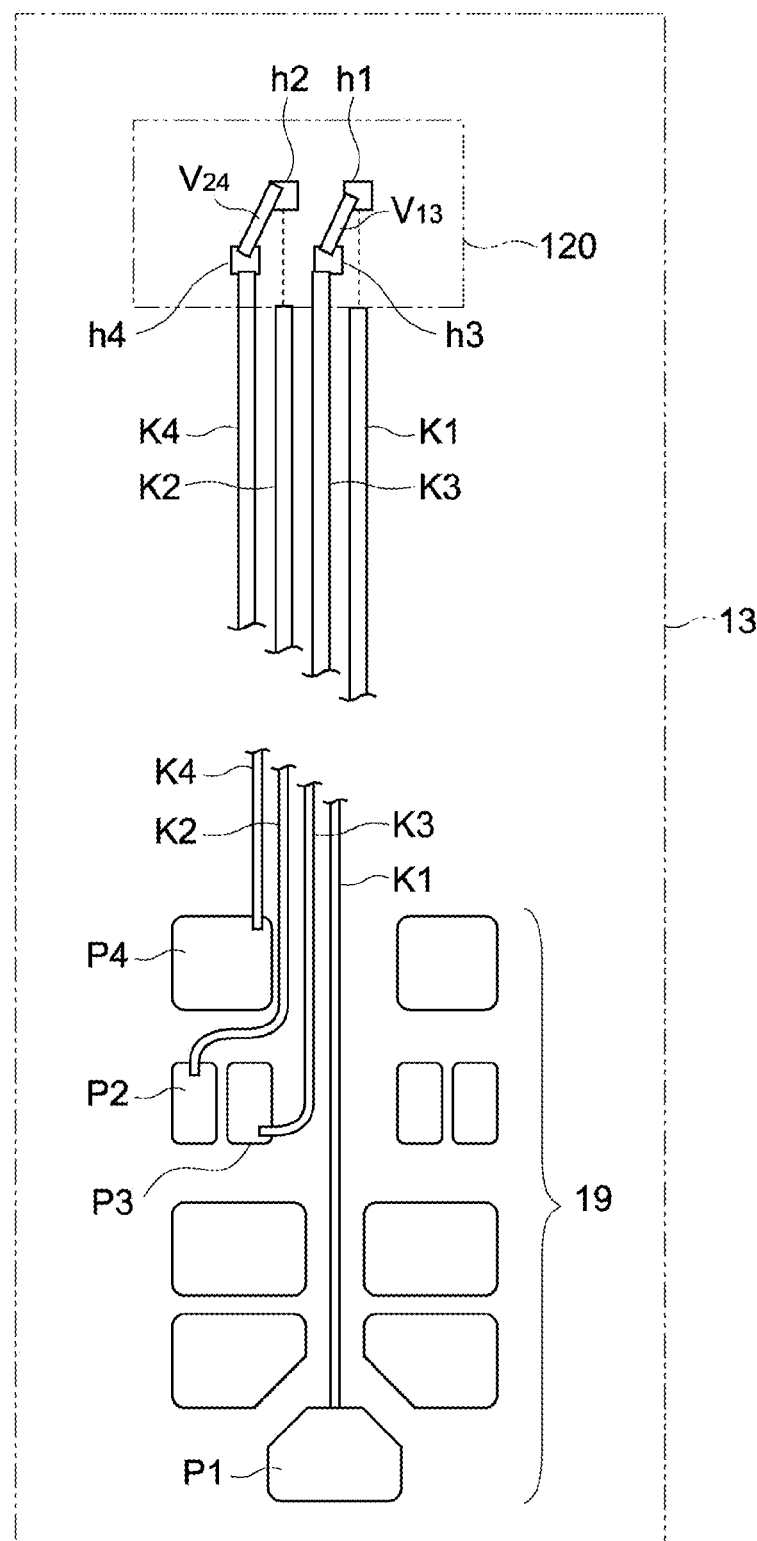
FIG. 15 A schematic plan view of the main portion, that shows a polarization processing wiring example of the piezoelectric detection unit.

FIG. 15 is a schematic plan view showing a wiring example for the polarization processing between the wiring lead unit 120 of the piezoelectric detection units $14A_2$, $14B_2$, $14C_{21}$, and $14C_{22}$ and the external connection terminal 19. The voltages requisite for the polarization are applied to the electrode films (connection holes h1 to h4) from the external connection terminal 19 via polarization wirings K1 to K4.

Here, the polarization wiring K1 connects the first electrode film 31 and a terminal P1, and the polarization wiring K2 connects the second electrode film 32 and a terminal P2. The polarization wiring K3 connects the third electrode film 33 exposed from the connection hole h3 and a terminal P3, and the polarization wiring K4 connects the fourth electrode film 34 exposed from the connection hole h4 and a terminal P4.

A wiring portion $V_{13}$ that mutually connects the first and third electrodes 31 and 33 is formed between the connection holes h1 and h3, and a wiring portion $V_{24}$ that mutually connects the second and fourth electrodes 32 and 34 is formed between the connection holes h2 and h4. Accordingly, the first piezoelectric film 41 arranged between the first and second electrodes 31 and 33 and the second piezoelectric film 42 arranged between the third and fourth electrodes 33 and 34 are connected to the external connection terminal 19 in parallel.

By the polarization wiring example described above, the polarization processing of the piezoelectric detection units $14A_2$, $14B_2$, $14C_{21}$, and $14C_{22}$ are carried out at the same time. While the polarization processing is also carried out on the piezoelectric driving units $14A_1$, $14B_1$, and $14C_1$ at the same time, since the piezoelectric films of the piezoelectric driving units are connected to the external connection terminals 19 in parallel as shown in FIG. 9, for example, routing of a new wiring for the polarization processing is unnecessary.

Figure 16:
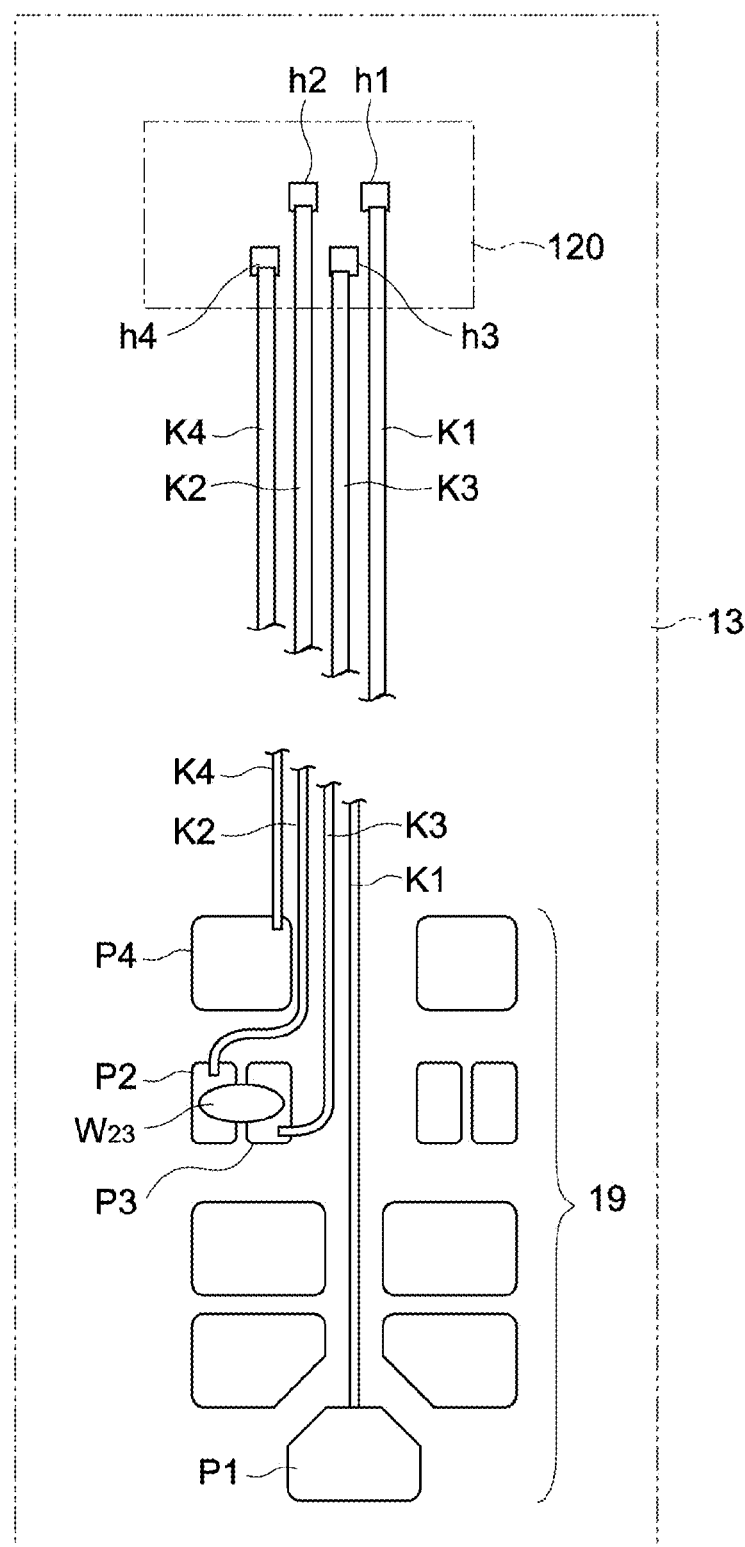
FIG. 16 A schematic plan view of the main portion, that shows a wiring example of the piezoelectric detection unit after the polarization processing.

FIG. 16 is a schematic plan view showing a wiring configuration of the wiring lead unit 120 and the external connection terminal 19 after the polarization processing.

After the polarization processing, the wiring portions $V_{13}$ and $V_{24}$ are removed. It is favorable for the wiring portions $V_{13}$ and $V_{24}$ to be configured by a metal material such as Cu, that can be easily removed by an etching solution.

The piezoelectric films of the piezoelectric detection units $14A_2$, $14B_2$, $14C_{21}$, and $14C_{22}$ are connected to the detection circuit C2 in series as described above. Although the second and third electrodes 32 and 33 respectively exposed from the connection holes h2 and h3 are connected by the wiring layer W2 in the wiring configuration shown in FIG. 10, short-circuit processing between the second and third electrodes 32 and 33 may be carried out on the external connection terminal 19 side as shown in FIG. 16. In other words, in the example shown in the figure, a conductive layer W23 that mutually connects the terminals P2 and P3 is provided. Typically, a solder material for bonding to the mounting substrate may be used for the conductive layer W23, or a bump formed across the terminals P2 and P3 may be used.

By the method as described above, it becomes possible to prevent an insufficient electric field in the piezoelectric detection units, element destruction in the piezoelectric driving units, a difference in the piezoelectric properties among the piezoelectric detection units and the piezoelectric driving units, and the like and execute appropriate polarization processing on both the piezoelectric detection units and the piezoelectric driving units.

Heretofore, the embodiment of the present technology has been described. However, the present technology is not limited to the embodiment above and can of course be variously modified.

For example, although the gyro sensor in which the vibrator is configured by three arms has been exemplified in the embodiment above, the present technology is not limited thereto and is also applicable to a gyro sensor capable of detecting angular velocities in three axial directions, that is described in Japanese Patent No. 4858662, for example, in addition to a gyro sensor in which a vibrator is configured by a single arm.

Moreover, although the piezoelectric functional bodies 14A to 14C provided on the front surface of the vibrator (arms) are each configured by the two piezoelectric functional layers, that is, the first and second piezoelectric functional layers 21 and 22 in the embodiment above, the present technology is not limited thereto, and a laminated configuration in which three or more piezoelectric functional layers are laminated may be used.

It should be noted that the present technology may also take the following configurations.

(1) A gyro sensor, including:
a vibrator;
a first piezoelectric functional layer that includes a first electrode pair and a first piezoelectric film arranged between the first electrode pair, is arranged on a front surface of the vibrator, and is capable of causing the vibrator to vibrate in a first axis direction vertical to the front surface; and
a second piezoelectric functional layer that includes a second electrode pair and a second piezoelectric film arranged between the second electrode pair, is arranged on the first piezoelectric functional layer, and is capable of causing the vibrator to vibrate in the first axis direction in sync with the first piezoelectric functional layer.

(2) The gyro sensor according to (1), in which
the first electrode pair includes a first driving electrode that is connected to a driving circuit and causes the vibrator to vibrate in the first direction, and
the second electrode pair includes a second driving electrode that is connected to the driving circuit in parallel with the first driving electrode and causes the vibrator to vibrate in the first direction.

(3) The gyro sensor according to (1) or (2), in which
the first electrode pair includes a first electrode film arranged between the vibrator and the first piezoelectric film and a second electrode film that sandwiches the first piezoelectric film with the first electrode film, and
the second electrode pair includes a third electrode film electrically connected to the second electrode film and a detection electrode that sandwiches the second piezoelectric film with the third electrode film and detects a vibration of the vibrator in a second axis direction parallel to the front surface of the vibrator.

(4) The gyro sensor according to (3), in which
the vibrator includes three arm portions arranged in the second axis direction and a base portion supporting the three arm portions,
the first piezoelectric functional layer and the second piezoelectric functional layer are provided on a front surface of each of the three arm portions, and
the detection electrode includes electrode portions respectively provided in the three arm portions and connection portions that are provided on the base portion and mutually connect the electrode portions of the two adjacent arm portions.

(5) The gyro sensor according to (4), in which
the electrode portion provided in the center arm portion out of the three arm portions has a larger electrode length than the electrode portions of the two arm portions positioned on an outer side in a third axis direction orthogonal to the first axis direction and the second axis direction.

(6) The gyro sensor according to (4) or (5), in which
the connection portions have a smaller electrode width than the electrode portions.

(7) The gyro sensor according to any one of (4) to (6), further including
a wiring layer that is provided on a front surface of the base portion and electrically connected to the first electrode film, the second electrode film, the third electrode film, and the detection electrode.

(8) The gyro sensor according to any one of (1) to (7), in which
the first piezoelectric film and the second piezoelectric film each have a thickness of 1 μm or less.

(9) An electronic apparatus, including
a gyro sensor including
a vibrator,
a first piezoelectric functional layer that includes a first electrode pair and a first piezoelectric film arranged between the first electrode pair, is arranged on a front surface of the vibrator, and is capable of causing the vibrator to vibrate in a first axis direction vertical to the front surface, and
a second piezoelectric functional layer that includes a second electrode pair and a second piezoelectric film arranged between the second electrode pair, is arranged on the first piezoelectric functional layer, and is capable of causing the vibrator to vibrate in the first axis direction in sync with the first piezoelectric functional layer.

DESCRIPTION OF SYMBOLS 12 arm
12A, 12B outer arm
12C center arm
base portion
14A, 14B, 14C piezoelectric functional body
$14A_1$, $14B_1$, $14C_1$ piezoelectric driving unit
$14A_2$, $14B_2$, $14C_{21}$, $14C_{22}$ piezoelectric detection unit
$14D_1$, $14D_2$ connection portion
21 first piezoelectric functional layer
22 second piezoelectric functional layer
31 first electrode film
32 second electrode film
33 third electrode film
34 fourth electrode film
41 first piezoelectric film
42 second piezoelectric film
52 intermediate insulation film
61 first driving electrode
62 second driving electrode
71 detection electrode
100 gyro sensor

The invention claimed is:
1. A gyro sensor, comprising:
a vibrator;
a first piezoelectric functional layer that includes a first electrode pair and a first piezoelectric film arranged between the first electrode pair, is arranged on a front surface of the vibrator, and is capable of causing the vibrator to vibrate in a first axis direction vertical to the front surface;
a second piezoelectric functional layer that includes a second electrode pair and a second piezoelectric film arranged between the second electrode pair, is arranged on the first piezoelectric functional layer, and is capable of causing the vibrator to vibrate in the first axis direction, the second piezoelectric functional layer functioning synchronously with the first piezoelectric functional layer to cause the vibrator to vibrate in the first axis direction; and
an intermediate insulation layer disposed between the first piezoelectric functional layer and the second piezoelectric functional layer.

2. A gyro sensor, comprising:
a vibrator;
a first piezoelectric functional layer that includes a first electrode pair and a first piezoelectric film arranged between the first electrode pair, is arranged on a front surface of the vibrator, and is capable of causing the vibrator to vibrate in a first axis direction vertical to the front surface; and
a second piezoelectric functional layer that includes a second electrode pair and a second piezoelectric film arranged between the second electrode pair, is arranged on the first piezoelectric functional layer, and is capable of causing the vibrator to vibrate in the first axis direction, the second piezoelectric functional layer functioning synchronously with the first piezoelectric functional layer to cause the vibrator to vibrate in the first axis direction, wherein
the first electrode pair includes a first electrode film arranged between the vibrator and the first piezoelectric film and a second electrode film that sandwiches the first piezoelectric film with the first electrode film, and
the second electrode pair includes a third electrode film electrically connected to the second electrode film and a detection electrode that sandwiches the second piezoelectric film with the third electrode film and detects a vibration of the vibrator in a second axis direction parallel to the front surface of the vibrator.

3. The gyro sensor according to claim 2, wherein
the first electrode pair includes a first driving electrode that is connected to a driving circuit and causes the vibrator to vibrate in the first axis direction, and
the second electrode pair includes a second driving electrode that is connected to the driving circuit in parallel with the first driving electrode and causes the vibrator to vibrate in the first axis direction.

4. The gyro sensor according to claim 2, wherein
the vibrator includes three arm portions arranged in the second axis direction and a base portion supporting the three arm portions,
the first piezoelectric functional layer and the second piezoelectric functional layer are provided on a front surface of each of the three arm portions, and
the detection electrode includes electrode portions respectively provided in the three arm portions and connection portions that are provided on the base portion and mutually connect the electrode portions of two adjacent arm portions of the three arm portions.

5. The gyro sensor according to claim 4, wherein
an electrode portion provided in a center arm portion of the three arm portions has a larger electrode length than electrode portions of two arm portions other than the center arm portion of the three arm portions, the two arm portions being positioned on an outer side in a third axis direction orthogonal to the first axis direction and the second axis direction.

6. The gyro sensor according to claim 4, wherein
the connection portions have a smaller electrode width than the electrode portions.

7. The gyro sensor according to claim 4, further comprising a wiring layer that is provided on a front surface of the base portion and electrically connected to the first electrode film, the second electrode film, the third electrode film, and the detection electrode.

8. The gyro sensor according to claim 2, wherein the first piezoelectric film and the second piezoelectric film each have a thickness of 1 µm or less.

9. An electronic apparatus, comprising
a gyro sensor including:
  a vibrator,
  a first piezoelectric functional layer that includes a first electrode pair and a first piezoelectric film arranged between the first electrode pair, is arranged on a front surface of the vibrator, and is capable of causing the vibrator to vibrate in a first axis direction vertical to the front surface, and
  a second piezoelectric functional layer that includes a second electrode pair and a second piezoelectric film arranged between the second electrode pair, is arranged on the first piezoelectric functional layer, and is capable of causing the vibrator to vibrate in the first axis direction, the second piezoelectric functional layer functioning synchronously with the first piezoelectric functional layer to cause the vibrator to vibrate in the first axis direction, wherein
  the first electrode pair includes a first electrode film arranged between the vibrator and the first piezoelectric film and a second electrode film that sandwiches the first piezoelectric film with the first electrode film, and
  the second electrode pair includes a third electrode film electrically connected to the second electrode film and a detection electrode that sandwiches the second piezoelectric film with the third electrode film and detects a vibration of the vibrator in a second axis direction parallel to the front surface of the vibrator.

* * * * *